(12) United States Patent
Kawaguchi (10) Patent No.: US 9,825,621 B2
(45) Date of Patent: Nov. 21, 2017

(54) INFORMATION PROCESSING APPARATUS CAPABLE OF REDUCING AMOUNT OF RADIATION NOISE AND CONTROL METHOD THEREFOR

(71) Applicant: CANON KABUSHIKI KAISHA, Tokyo (JP)

(72) Inventor: Tadashi Kawaguchi, Matsudo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/012,964

(22) Filed: Feb. 2, 2016

(65) Prior Publication Data

US 2016/0233857 A1    Aug. 11, 2016

(30) Foreign Application Priority Data

Feb. 5, 2015 (JP) ................. 2015-021552

(51) Int. Cl.
*H03K 7/06* (2006.01)
(52) U.S. Cl.
CPC ................... *H03K 7/06* (2013.01)
(58) Field of Classification Search
CPC ................................ H03K 7/06
USPC ................... 327/113, 114, 551
See application file for complete search history.

(56) References Cited

U.S. PATENT DOCUMENTS

| | | | | |
|---|---|---|---|---|
| 5,463,352 A * | 10/1995 | Chen | ......... | H03L 1/00 331/1 R |
| 6,754,837 B1 * | 6/2004 | Helms | ........... | G06F 1/3203 327/114 |
| 2005/0099210 A1 * | 5/2005 | Fetzer | ........... | G06F 1/3203 327/101 |
| 2006/0052962 A1 * | 3/2006 | Shipton | ........... | B41J 2/04505 702/106 |
| 2008/0068100 A1 * | 3/2008 | Goodnow | ........... | H03K 3/0315 331/57 |
| 2009/0063876 A1 * | 3/2009 | Takeuchi | ........... | G06F 1/3203 713/300 |
| 2009/0144578 A1 * | 6/2009 | Tatsumi | ........... | G06F 1/3296 713/340 |
| 2012/0327689 A1 * | 12/2012 | Kosaka | ........... | G03G 15/80 363/16 |
| 2013/0297953 A1 * | 11/2013 | Hayashi | ........... | G06F 1/324 713/300 |
| 2017/0124007 A1 * | 5/2017 | Zehavi | ........... | G06F 13/1689 |

FOREIGN PATENT DOCUMENTS

JP     2011227937 A    11/2011

* cited by examiner

*Primary Examiner* — William Hernandez
(74) *Attorney, Agent, or Firm* — Rossi, Kimms & McDowell LLP (57) ABSTRACT

An information processing apparatus which is capable of maintaining the amount of radiation noise from a semiconductor integrated circuit constant. A voltage value information storage unit holds information indicative of a voltage to be applied to the semiconductor integrated circuit. A sub CPU modulates a clock frequency of a clock to be supplied to the semiconductor integrated circuit with a modulation width determined based on the information held in the voltage value information storage unit and supplies the clock.

12 Claims, 8 Drawing Sheets

| OPERATING SPEED | DEVICE TYPE | CLOCK FREQUENCY (MHz) | APPLIED VOLTAGE VALUE (V) | FREQUENCY MODULATION FACTOR (%) |
|---|---|---|---|---|
| HIGH | 1 | 206 | 1.00 | DEFAULT VALUE |
| ↑ | 2 | 204 | 1.02 | DEFAULT VALUE |
|  | 3 | 202 | 1.04 | DEFAULT VALUE |
| REFERENCE | 4 | 200 | 1.06 | DEFAULT VALUE |
| ↓ | 5 | 198 | 1.08 | 0.5 |
|  | 6 | 196 | 1.10 | 1.0 |
|  | 7 | 194 | 1.12 | 1.5 |
| LOW | 8 | 192 | 1.14 | 2.0 |

| OPERATING SPEED | DEVICE TYPE | CLOCK FREQUENCY (MHz) | APPLIED VOLTAGE VALUE (V) |
|---|---|---|---|
| HIGH | 1 | 206 | 1.00 |
|  | 2 | 204 | 1.02 |
| ↑ | 3 | 202 | 1.04 |
| REFERENCE | 4 | 200 | 1.06 |
| ↓ | 5 | 198 | 1.08 |
|  | 6 | 196 | 1.10 |
|  | 7 | 194 | 1.12 |
| LOW | 8 | 192 | 1.14 |

FIG. 8
*PRIOR ART*

INFORMATION PROCESSING APPARATUS CAPABLE OF REDUCING AMOUNT OF RADIATION NOISE AND CONTROL METHOD THEREFOR

BACKGROUND OF THE INVENTION

Field of the Invention

The present invention relates to an information processing apparatus and a control method therefor.

Description of the Related Art

Information processing apparatuses such as printing apparatuses conventionally have semiconductor integrated circuits, and along with speed-up, density-growth, and digitalization of semiconductor integrated circuits, radiation noise generated due to emission of harmonic energy of a clock signal in the semiconductor integrated circuits to an external of the semiconductor integrated circuit is increasing. Radiation noise interferes with operation of other electronic devices, and hence filters, packages, ferrite beads, or the like are applied to semiconductor integrated circuits, and also, frequency diffusing circuits are used as semiconductor integrated circuits in order to reduce radiation noise generated from semiconductor integrated circuits.

Frequency diffusing circuits add a frequency modulation factor as a several-% tolerance to a specific clock frequency and diffuse harmonic energy, which is generated at the specific clock frequency, in frequency bands outside the range of the frequency modulation factor, thereby reducing radiation noise at the specific clock frequency. For example, when a frequency diffusing circuit adds a frequency modulation factor of 1% to a clock frequency of 100 MHz, harmonic energy generated at 100 MHz is diffused within a range of 99 MHz to 100 MHz to thus reduce radiation noise at 100 MHz.

When a plurality of semiconductor integrated circuits are manufactured, the semiconductor integrated circuits vary in performance, for example, clock frequency. Namely, some of the manufactured plurality of semiconductor integrated circuits operate at high clock frequencies, and others operate at low clock frequencies. Accordingly, there are known semiconductor integrated circuits with an ASV (adaptive supply voltage) function of controlling voltage applied to the semiconductor integrated circuits according to variations in clock frequencies of the semiconductor integrated circuits (see, for example, Japanese Laid-Open Patent Publication (Kokai) No. 2011-227937).

Figure 7:
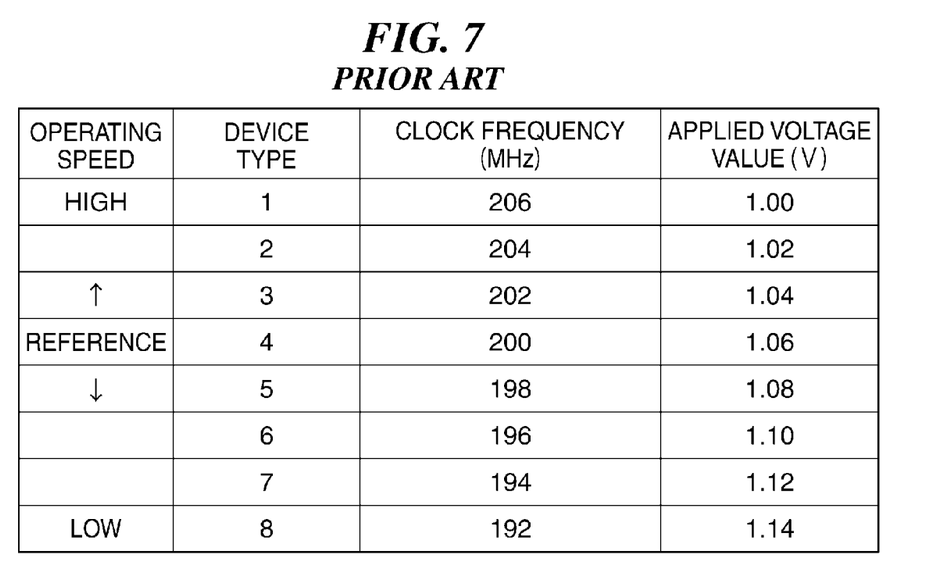
FIG. 7 is a diagram useful in explaining the relationship between clock frequencies and voltages applied to conventional semiconductor integrated circuits when the operating speed of the semiconductor integrated circuits is held constant.

The semiconductor integrated circuits with the ASV function raise voltage applied to semiconductor integrated circuits with low clock frequencies when they are in use, and on the other hand, lower voltage applied to semiconductor integrated circuits operating at high clock frequencies when they are in use so that operating speeds of the semiconductor integrated circuits can be maintained constant when they are in use. For example, as shown in FIG. 7, a voltage of 1.00 V is applied to a semiconductor integrated circuit with a high clock frequency of 206 MHz, a voltage of 1.06 V is applied to a semiconductor integrated circuit with a moderate clock frequency of 200 MHz, and a voltage of 1.14 V is applied to a semiconductor integrated circuit with a low clock frequency of 192 MHz.

Figure 8:
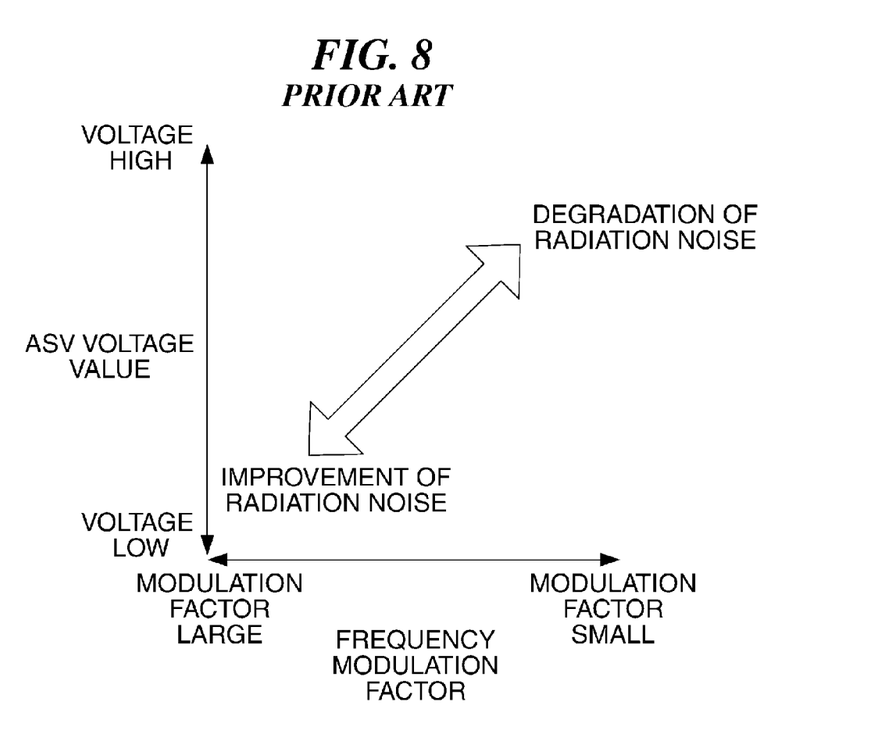
FIG. 8 is a diagram useful in explaining the relationship among voltage values of voltages applied to semiconductor integrated circuits, frequency modulation factors added to clock frequencies of the semiconductor integrated circuits, and the amount of radiation noise radiated from the semiconductor integrated circuits.

Radiation noise generated from semiconductor integrated circuits increases as voltage values of voltages applied to the semiconductor integrated circuits increase, and decrease as voltage values of voltages applied to the semiconductor integrated circuits decrease. On the other hand, it is known that radiation noise increases as frequency modulation factors added to clock frequencies decrease, and decreases as frequency modulation factors added to clock frequencies increase (see FIG. 8).

However, in semiconductor integrated circuits with the ASV function, frequency modulation factors added to clock frequencies are fixed, and hence the amount of radiation noise generated from the semiconductor intergraded circuits with the ASV function depends on voltages applied to the semiconductor integrated circuits. Therefore, when voltages applied to semiconductor integrated circuits are changed so as to maintain the operating speed of semiconductor integrated circuits constant using the ASV function, a problem arises because the amount of radiation noise from the semiconductor integrated circuits cannot be controlled to be held constant.

SUMMARY OF THE INVENTION

The present invention provides an information processing apparatus and a control method therefor, which are capable of maintaining the amount of radiation noise from semiconductor integrated circuits constant.

Accordingly, the present invention provides an information processing apparatus comprising a circuit, a holding unit configured to hold information indicative of a voltage to be applied to the circuit, and a clock supply unit configured to modulate a clock frequency of a clock to be supplied to the circuit with a modulation width determined based on the information held in the holding unit and supply the clock.

According to the present invention, the amount of radiation noise from semiconductor integrated circuits is maintained constant.

Further features of the present invention will become apparent from the following description of exemplary embodiments (with reference to the attached drawings).

DESCRIPTION OF THE EMBODIMENTS

Hereafter, an embodiment of the present invention will be described in detail with reference to the drawings.

Figure 1:
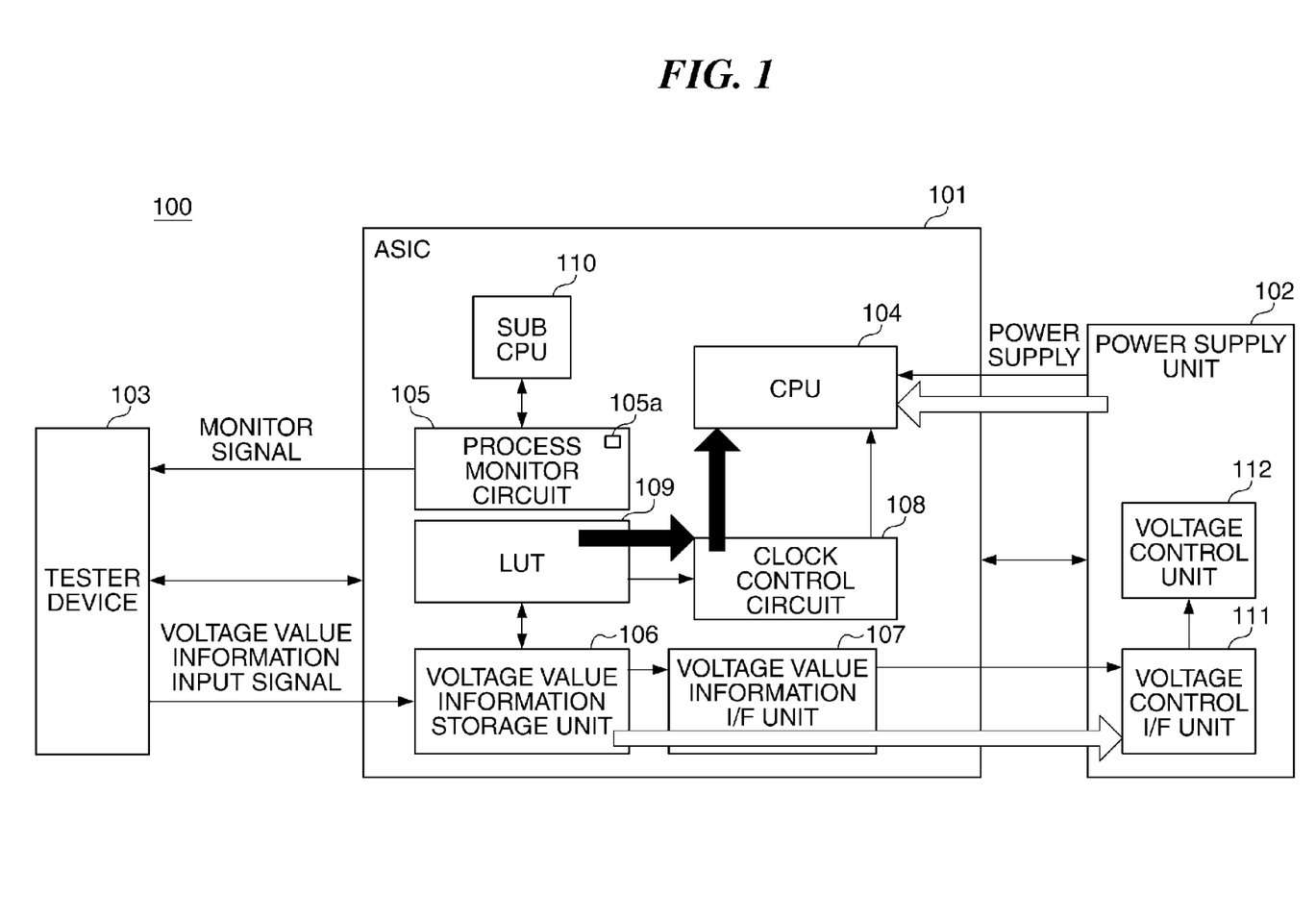
FIG. 1 is a conceptual diagram schematically showing an arrangement of a test system which determines a voltage value applied to an ASIC, which is a semiconductor integrated circuit with an ASV function, based on a clock frequency of the ASIC in an information processing apparatus according to an embodiment of the present invention.

FIG. 1 is a conceptual diagram schematically showing an arrangement of a test system 100 which determines a voltage value of a voltage applied to an ASIC 101, which is a semiconductor integrated circuit with an ASV function, based on a clock frequency of the ASIC 101 in an information processing apparatus according to the embodiment of the present invention.

The test system 100 in FIG. 1 has an ASIC 101, a power supply unit 102, and a tester device 103, and the power supply unit 102 and the tester device 103 are connected together via the ASIC 101. The ASIC 101 has a CPU 104, a process monitor circuit 105, a voltage value information storage unit 106, a voltage value information I/F unit 107, a clock control circuit 108, an LUT 109, and a sub CPU 110, and the power supply unit 102 has a voltage control I/F unit 111 and a voltage control unit 112. The process monitor circuit 105 has a ring oscillator 105a.

The power supply unit 102 supplies power to component elements of the ASIC 101. The power supply unit 102 controls voltage which is to be applied to the ASIC 101. The CPU 104 executes programs stored in a ROM unit 310, to be described later. The process monitor circuit 105 detects a clock frequency oscillated from the ring oscillator 105a and outputs the detected clock frequency as a monitor signal to the tester device 103. The tester device 103 outputs information on a voltage value of a voltage, which is determined based on a clock frequency of the ASIC 101 input from the process monitor circuit 105 and applied to the ASIC 101 (hereafter referred to as an "ASV value"), as a voltage value information input signal to the voltage value information storage unit 106, which in turn stores the information on the ASV value. Information on the ASV value stored in the voltage value information storage unit 106 is stored in the voltage control circuit 112 by way of the voltage value information I/F unit 107 and the voltage control I/F unit 111.

The sub CPU 110 controls component elements of the ASIC 101 when the ASV function which the ASIC 101 has is executed. The sub CPU 110 also determines a frequency modulation factor, which is added to a clock frequency of the ASIC 101, based on information on an ASV value, which is stored in the voltage value information storage unit 106 (holding unit), and a reference table 500 (FIG. 5), to be described later, stored in the LUT 109. The determined frequency modulation factor is set in the clock control circuit 108.

Figure 2:
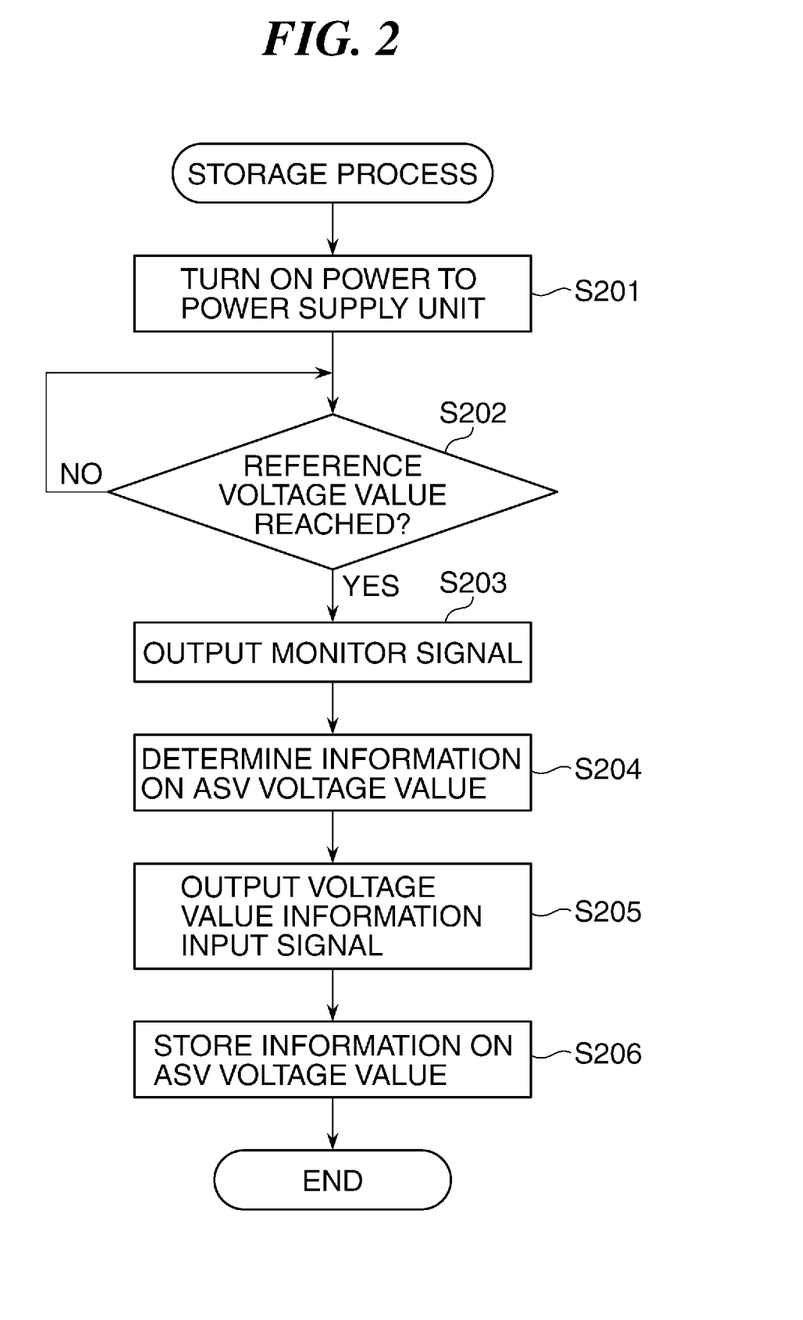
FIG. 2 is a flowchart showing the procedure of a storage process in which an ASV applied to the ASIC in FIG. 1 is stored in a voltage value information storage unit.

FIG. 2 is a flowchart showing the procedure of a storage process in which an ASV value, which is to be applied to the ASIC 101 in FIG. 1, is stored in the voltage value information storage unit 106.

Referring to FIG. 2, first, when the power to the power supply unit 102 is turned on (step S201), the sub CPU 110 determines whether or not a voltage applied to the ASIC 101 has reached a voltage value set in advance in the ASIC 101 (hereafter referred to as "the reference voltage value") (step S202). As a result of the determination in the step S202, when the voltage applied to the ASIC 101 has not reached the reference voltage value, the process returns to the step S202, and when the voltage applied to the ASIC 101 has reached the reference voltage value, the ring oscillator 105a starts clock oscillation, and the process monitor circuit 105 outputs a clock frequency oscillated from the ring oscillator 105a as a monitor signal to the tester device 103 (step S203).

The tester device 103 analyzes the monitor signal and determines an ASV value (step S204). Specifically, as shown in the table of FIG. 7, the lower the clock frequency, the higher the ASV value determined by the tester device 103. After that, the tester device 103 outputs information on the determined ASV value as a voltage value information input signal to the voltage value information storage unit 106 (step S205), which in turn stores the information on the determined ASV value (step S206), and terminates the present process.

Figure 3:
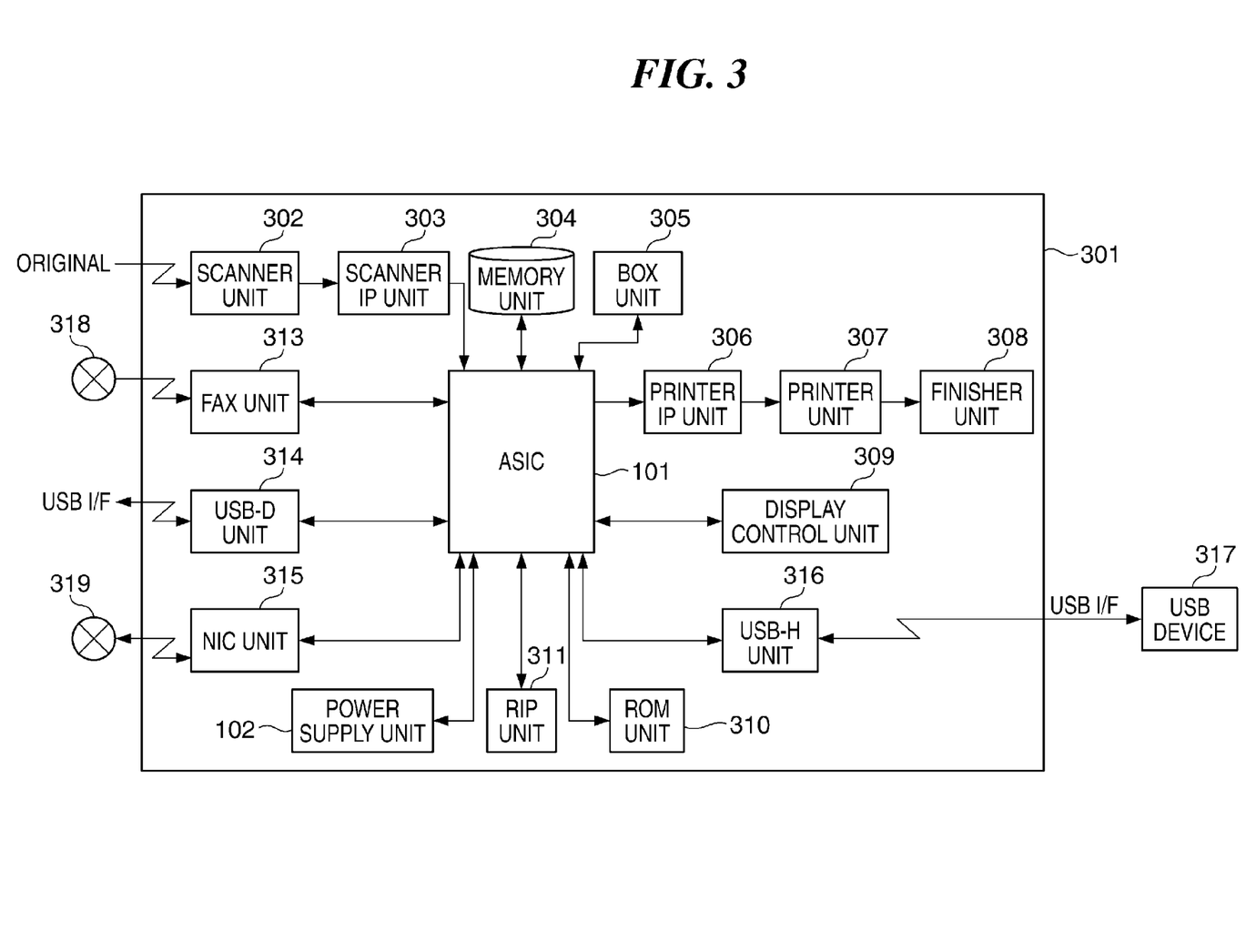
FIG. 3 is a block diagram schematically showing an internal arrangement of an MFP, which is the information processing apparatus having the ASIC and a power supply unit in FIG. 1.

FIG. 3 is a block diagram schematically showing an internal arrangement of an MFP (multi-function printer) 301, which is an information processing apparatus having the ASIC 101 and the power supply unit 102 in FIG. 1.

The MFP 301 in FIG. 3 has the ASIC 101, the power supply unit 102, a scanner unit 302, a scanner IP unit 303, a memory unit 304, a box unit 305, a printer IP unit 306, a printer unit 307, a finisher unit 308, a display control unit 309, a ROM unit 310, a RIP unit 311, a FAX unit 313, a USB-D unit 314, a NIC unit 315, a USB-H unit 316, a USB device 317, a telephone line 318, and a network 319.

The power supply unit 102, the scanner IP unit 303, the memory unit 304, the box unit 305, the printer IP unit 306, the display control unit 309, the ROM unit 310, the RIP unit 311, the FAX unit 313, the USB-D unit 314, the NIC unit 315, and the USB-H unit 316 are connected to one another via the ASIC 101. The scanner unit 302 is connected to the scanner IP unit 303, the finisher unit 308 is connected to the printer unit 307, the printer unit 307 is connected to the printer IP unit 306, the FAX unit 313 is connected to the telephone line 318, the USB-D unit 314 is connected to an external apparatus via a USB I/F, the NIC unit 315 is connected to the network 319 via the network I/F, and the USB device 317 is connected to the USB-H unit 316 via a USB I/F.

The ASIC 101 controls the overall operation of the MFP 301 in accordance with programs stored in the ROM unit 310. The scanner unit 302 reads an original using a photoelectric conversion element and performs A/D conversion and/or shading correction to generate an RGB digital image. The scanner IP unit 303 subjects the RGB digital image to various types of image processing. The memory unit 304 is a main memory for the ASIC 101 and also a work memory for use when various types of processing are performed. The memory unit 304 also stores various types of data.

The box unit 305 is a buffer area for use when the MFP 301 sends data to an external apparatus or receives data from an external apparatus. The printer IP unit 306 generates image data based on a signal output from the ASIC 101, and the printer unit 307 prints the image data on a recording sheet. The finisher unit 308 performs, for example, stapling on a recording sheet on which image data has been printed by the printer unit 307. The display control unit 309 sends an instruction from a user to the ASIC 101 or displays an instruction from the ASIC 101. The ROM unit 310 stores various types of programs such as a program for controlling the overall operation of the MFP 301 and a boot program for starting an OS. The RIP unit 311 generates bitmap image data from image data. The power supply unit 102 supplies power to component elements of the MFP 301 such as the ASIC 101. The FAX unit 313 carries out facsimile communications via the telephone line 318.

The USB-D unit 314 receives print data from an external apparatus connected thereto via the USB/IF. The NIC unit 315 obtains various types of data such as image data and packets via the network 319. The NIC unit 315 is controlled by an NW communication control driver (not shown). Here, the NW communication control driver is software which recognizes that the NIC unit 315 has obtained various types of data via the network 319 and also analyzes the obtained data. The USB-H unit 316 controls the USB device 317 connected thereto via a USB/IF. The USB device 317 is, for example, a tablet terminal, a USB memory, or a card reader.

Figure 4A:
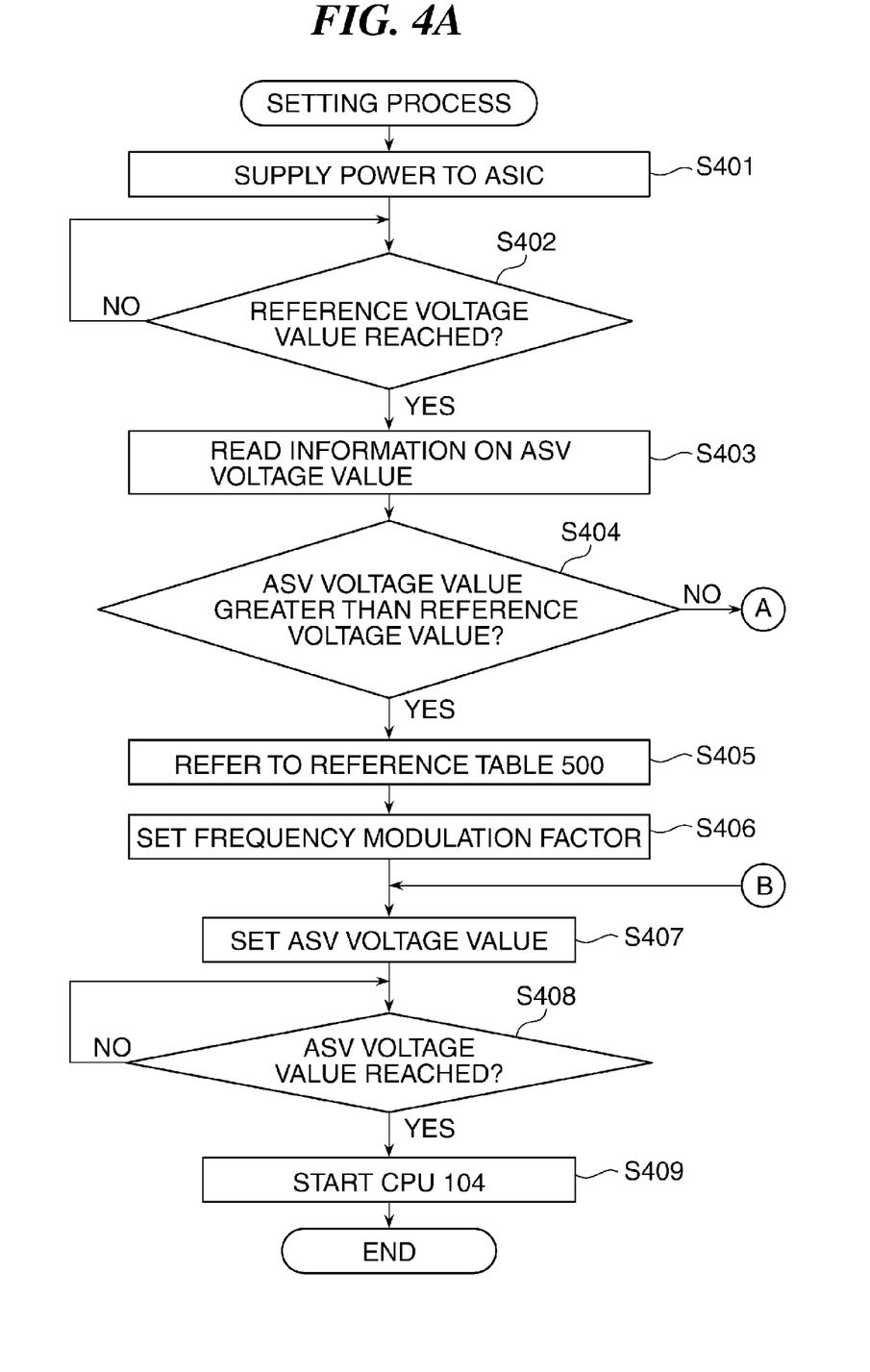
FIGS. 4A and 4B are flowcharts showing the procedure of a setting process in which a frequency modulation factor is set in a clock control circuit which the ASIC in FIG. 3 has, and an ASV value is set in the power supply unit in FIG. 3.
Figure 4B:
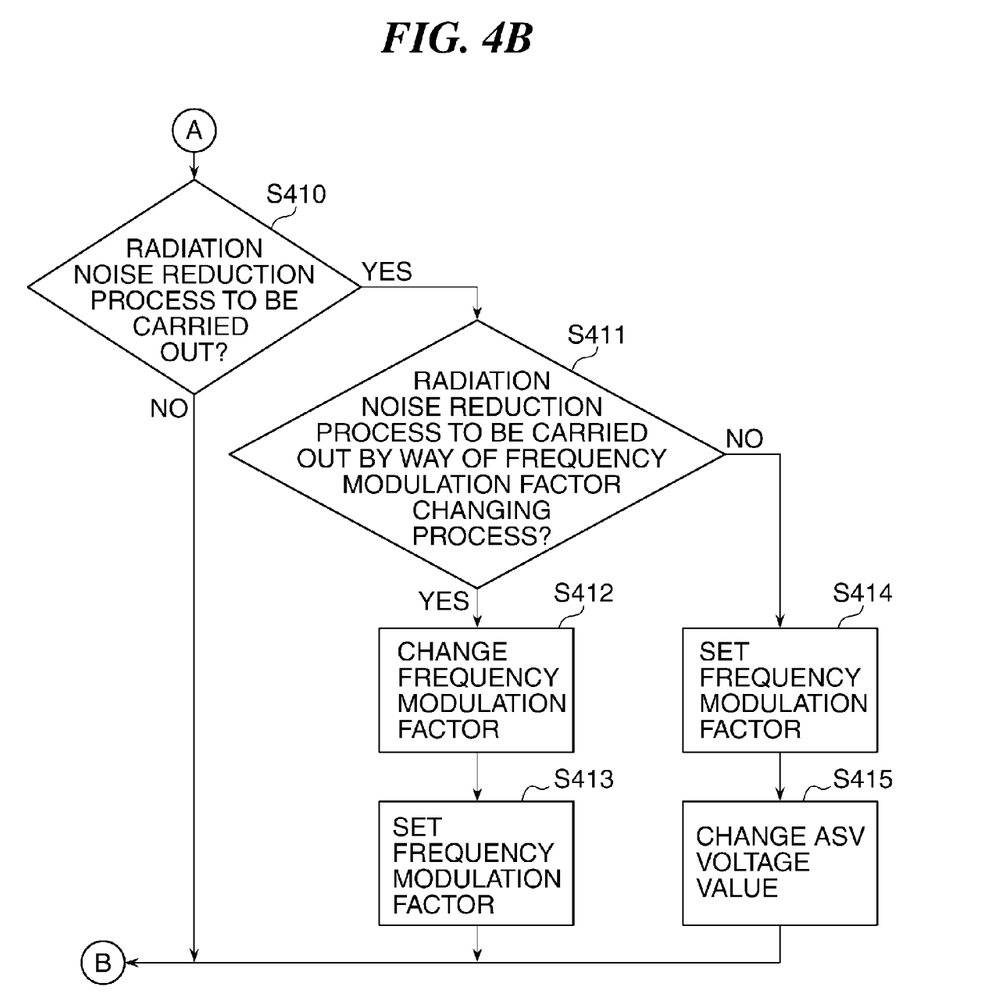

FIGS. 4A and 4B are flowcharts showing the procedure of a setting process in which a frequency modulation factor is set in the clock control circuit 108 which the ASIC 101 in FIG. 3 has, and an ASV value is set in the power supply unit 102 in FIG. 3. The process in FIGS. 4A and 4B is carried out by the sub CPU 110 (clock supply unit).

Referring to FIGS. 4A and 4B, first, when the power to the MFP 301 is turned on, power is supplied from the power supply unit 102 to the ASIC 101 (step S401). Next, the sub CPU 110 determines whether or not a voltage applied to the ASIC 101 has reached the reference voltage value (step S402).

As a result of the determination in the step S402, when the voltage applied to the ASIC 101 has not reached the reference voltage value, the process returns to the step S402, and when the voltage applied to the ASIC 101 has reached the reference voltage value, the sub CPU 110 reads information on an ASV value, which is determined in advance and stored in the voltage value information storage unit 106 (step S403), to determine whether or not the ASV value is higher than the reference voltage value (step S404). When the ASV value is lower than the reference voltage value, radiation noise generated when the ASV value is applied to the ASIC 101 (hereafter referred to as "in-application radiation noise) is considered to fall inside an allowable range, and when the ASV value is higher than the reference voltage value, in-application radiation noise is considered to fall outside the allowable range. Therefore, when the ASV value is higher than the reference voltage value, an action to reduce in-application radiation noise should be taken. Accordingly, in the present embodiment, a frequency modulation factor is changed so as to reduce in-application radiation noise.

Specifically, as a result of the determination in the step S404, when the ASV value is higher than 1.06 V, which is the reference voltage value, the sub CPU 110 refers to the reference table 500 (storage unit) stored in the LUT 109 (step S405), and based on the ASV value and the reference table 500, sets a frequency modulation factor corresponding to the ASV value in the clock control circuit 108 (step S406).

Figure 5:
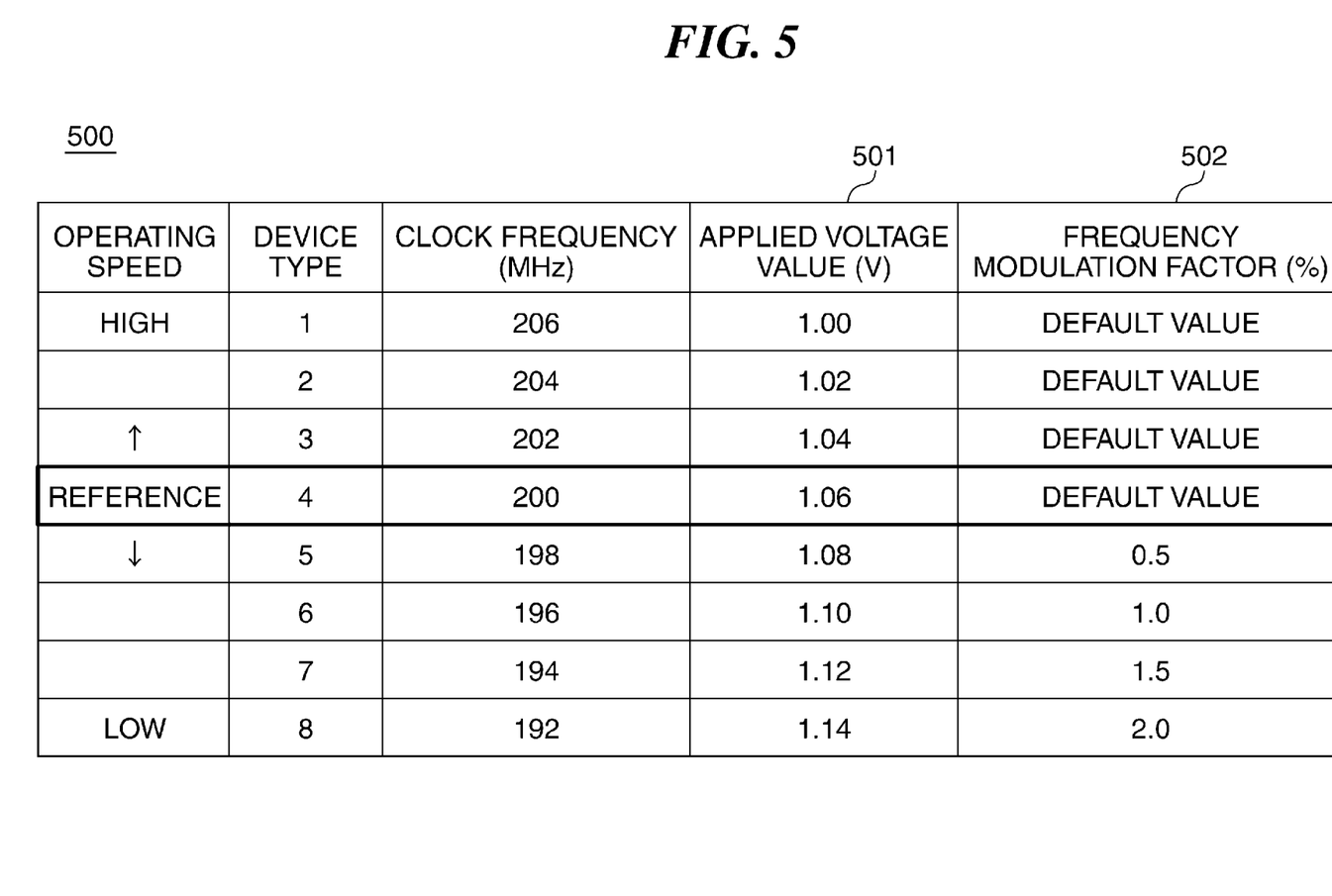
FIG. 5 is a diagram useful in explaining a reference table which is referred to in the setting process in FIGS. 4A and 4B.

Referring to FIG. 5, in the reference table 500, frequency modulation factors 502 are individually set for respective applied voltage values 501 which are ASV values. Namely, in the reference table 500, the frequency modulation factor 502 varies with changes in the applied voltage values 501. For the respective applied voltage values 501 not more than 1.06 V which is the reference voltage value, a unique default value is set as the frequency modulation factors 502. On the other hand, for the respective applied voltage values 501 higher than 1.06 V which is the reference voltage value, the frequency modulation factors 502 are set such that the frequency modulation factors 502 increase as the applied voltage values 501 increase. It should be noted that percentages added to the default value are set as the frequency modulation factors 502 other than the default values.

Figure 6A:
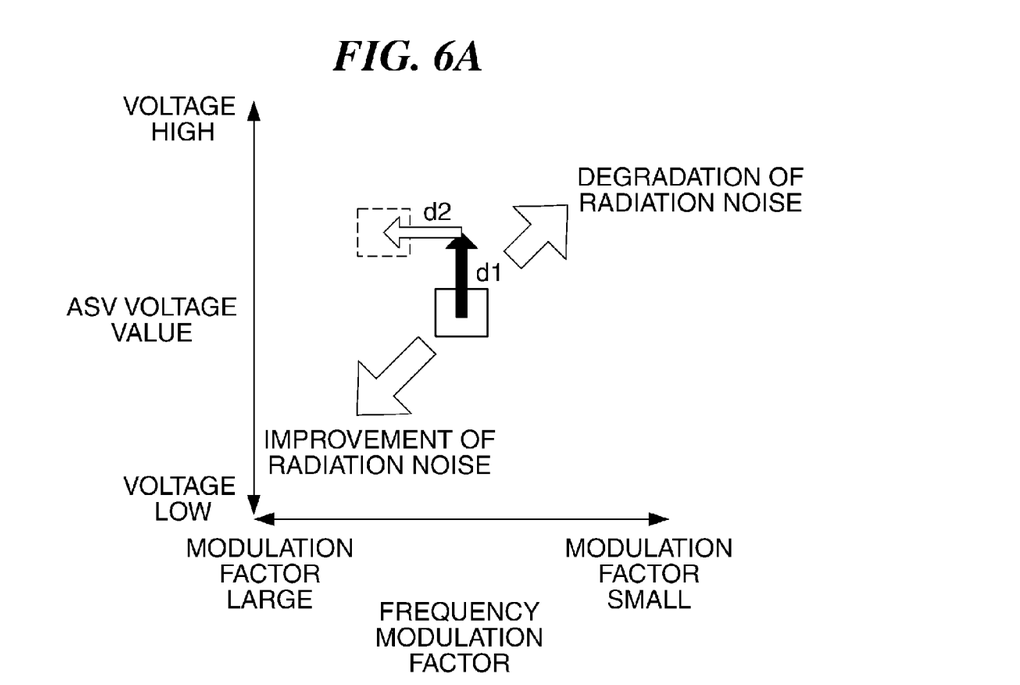
FIGS. 6A and 6B are conceptual diagrams schematically showing behaviors of radiation noise when a frequency modulation factor is set in the clock control circuit which the ASIC in FIG. 3 has, and a voltage with an ASV value is applied to the ASIC for which the ASV value is set in the power supply unit in FIG. 3.

The higher the voltage value of voltage applied to the ASIC 101, the greater the amount of radiation noise radiated from the ASIC 101. In the reference table 500, as described above, the frequency modulation factors 502 increase as the applied voltage values 501 higher than 1.06 V which is the reference voltage value increase. Thus, when an ASV value higher than 1.06V which is the reference voltage value is applied to the ASIC 101, and in-application radiation noise is likely to increase (see an arrow d1 in FIG. 6A), the amount of in-application radiation noise is reduced by increasing a frequency modulation factor to be added (see an arrow d2 in FIG. 6A). Namely, in the reference table 500, the applied voltage values 501, which are ASV values, and the frequency modulation factors 502 are associated with each other so as to reduce in-application radiation noise.

It should be noted that when the reference voltage value is 1.06V in the case where the reference table 500 is used, the default value which is a frequency modulation factor for 1.00 V stored as the applied voltage value 501 is set in the clock control circuit 108 when a voltage of 1.00 V lower than the reference voltage value is applied as an ASV value to the ASIC 101. Also, when a voltage of 1.14 V higher than the reference voltage value is applied as an ASV value to the ASIC 101, a frequency modulation factor which is for 1.14 V stored as the applied voltage value 501 and obtained by adding 2.0% to the default value is set in the clock control circuit 108.

Referring again to FIG. 4A, the sub CPU 110 sets the ASV value in the power supply unit 102 (step S407) and determines whether or not the voltage value of the voltage applied to the ASIC 101 has reached the ASV value (step S408). As a result of the determination in the step S408, when the voltage value of the voltage applied to the ASIC 101 has not reached the ASV value, the process returns to the step S408, and when the voltage value of the voltage applied to the ASIC 101 has reached the ASV value, the sub CPU 110 starts the CPU 104 (step S409) and terminates the present process.

When the ASV value is lower than the reference voltage value, in-application radiation noise falls inside an allowable range, and hence it is not always necessary to take an action to reduce in-application radiation noise. Accordingly, in the present embodiment, when the ASV value is smaller than the reference voltage value, the sub CPU 110 determines whether or not to carry out a radiation noise reducing process in which the amount of radiation noise is reduced.

Specifically, as a result of the determination in the step S404, when the ASV value is smaller than the reference voltage value, the sub CPU 110 determines whether or not to carry out the radiation noise reducing process (step S410). The determination in the step S410 is made based on, for example, a user's intent as to the radiation noise reducing process (such as intent to further reduce radiation noise already falling inside an allowable range).

As a result of the determination in the step S410, when the radiation noise reducing process is not to be carried out, the process proceeds to the step S407, and when the radiation noise reducing process is to be carried out, the sub CPU 110 determines whether or not the radiation noise reducing process should be carried out by means of a frequency modulation factor changing process (step S411).

To reduce in-application radiation noise, there are two measures, i.e. increase of the frequency modulation factor and decrease of the ASV value. When the ASV value is decreased, however, the operating speed of the ASIC 101 may decrease. The operating speed of the ASIC 101 relates to the clock frequency of the ASIC 101 as well, and hence the operating speed of the ASIC 101 is low at low clock frequencies. Thus, in the present embodiment, when the clock frequency of the ASIC 101 is low, the ASV value is not decreased but the frequency modulation factor is increased as a measure to reduce in-application radiation noise so that a decrease in the operating speed of the ASIC 101 can be avoided. Specifically, when the clock frequency of the ASIC 101 is lower than 200 MHz, the sub CPU 110 determines that the radiation noise reducing process should be carried out by means of the frequency modulation factor changing process.

Figure 6B:
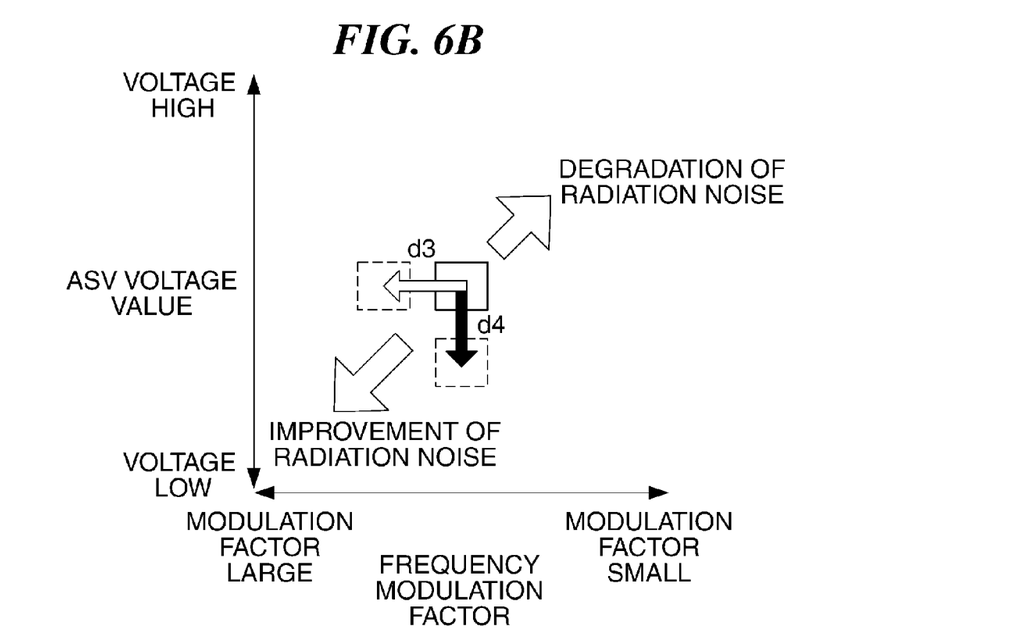

As a result of the determination in the step S411, when the radiation noise reducing process should be carried out by means of the frequency modulation factor changing process, the sub CPU 101 changes the frequency modulation factor so that the frequency modulation factor increases as the clock frequency lowers using the reference table 500 (step S412), and sets the changed frequency modulation factor in the clock control circuit 108 (step S413), followed by the process proceeding to the step S407. At this time, in-application radiation noise is reduced (see an arrow d3 in FIG. 6B), but the ASV value does not change, and therefore, the operating speed of the ASIC 101 does not decrease.

On the other hand, when the clock frequency of the ASIC 101 is high, the operating speed of the ASIC 101 as well is high, and hence even when the operating speed of the ASIC 101 is lowered by decreasing the ASV value, the operating speed of the ASIC 101 is considered to fall inside an allowable range. Thus, in the present embodiment, when the clock frequency of the ASIC 101 is high, the frequency modulation factor is not increased but the ASV value is decreased as a measure to reduce in-application radiation noise. Specifically, when the clock frequency of the ASIC 101 is not less than 200 MHz (predetermined value), the sub CPU 110 determines that the radiation noise reducing process should not be carried out by means of the frequency modulation factor changing process.

As a result of the determination in the step S411, when it is determined that the radiation noise reducing process should not be carried out by means of the frequency modulation factor changing process, the sub CPU 101 sets the default value as a frequency modulation factor in the clock control circuit 108 using the reference table 500 (step S414) and changes the frequency modulation factor so that the ASV value set in the power supply unit 102 can decrease as the clock frequency rises (step S415), followed by the process proceeding to the step S407. At this time, in-application radiation noise decreases, and the operating speed of the ASIC 101 lowers as well (see an arrow d4 in FIG. 6B), but the operating speed of the ASIC 101 falls inside an allowable range since the original clock frequency is high.

According to the process in FIGS. 4A and 4B, in the reference table 500, ASV values and frequency modulation factors, which are added to clock frequencies of the ASIC 101, are associated with each other so as to reduce radiation noise generated from the ASIC 101 (in-application radiation noise), and based on an ASV value and the reference table 500, a frequency modulation factor for the ASV value is set in the clock control circuit 108 (step S406), and the ASV value is set in the power supply unit 102 (step S407). Here, the amount of radiation noise radiated from the ASIC 101 varies with voltages applied to the ASIC 101, but since a frequency modulation factor is set in the clock control circuit 108 based on the reference table 500, a frequency modulation factor that is associated with an ASV value so as to reduce radiation noise generated from the ASIC 101 is set in the clock control circuit 108, and this maintains the amount of radiation noise generated from the ASIC 101 constant.

As a result, there is no ASIC 101 which generates a greater amount of radiation noise than other ASICs 101 do, and this eliminates the need to apply a filter, a cabinet, a ferrite bead, or the like to the ASIC 101 so as to reduce radiation noise generated from the ASIC 101, thereby reducing costs required for such a filter, a cabinet, a ferrite bead, or the like.

Moreover, in the reference table 500, ASV values and frequency modulation factors, which are added to clock frequencies of the ASIC 101, are associated with each other such that the frequency modulation factors increase as the applied voltage values 501 which are the ASV values increase, and therefore, when the amount of radiation noise generated from the ASIC 101 is increased due to an increased ASV value, the frequency modulation factor added to clock frequencies of the ASIC 101 increases. When the frequency modulation factor added to clock frequencies of the ASIC 101 increases, the amount of radiation noise generated from the ASIC 101 is reduced. This avoids an increase in the amount of radiation noise generated from semiconductor integrated circuits and thus makes the amounts of radiation noise generated from the ASICs 101 equal.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-021552, filed Feb. 5, 2015, which is hereby incorporated by reference herein in its entirety.

What is claimed is:

1. An information processing apparatus comprising:
a circuit;
a storage which stores information indicative of a voltage to be applied to said circuit; and
a clock control circuit which modulates a clock frequency of a clock to be supplied to said circuit with a modulation range corresponding to the information stored in said storage.

2. The information processing apparatus according to claim 1, further comprising a data table which stores a voltage and a modulation range for the clock frequency of the clock in association with each other.

3. The information processing apparatus according to claim 1, wherein said clock control circuit does not modulate the clock frequency of the clock to be supplied to said circuit if a voltage corresponding to the information in said storage is not less than a predetermined value.

4. An information processing apparatus comprising:
a circuit;
a power supply unit which supplies a voltage to said circuit; and
a clock control unit which modulates a clock frequency of a clock to be supplied to said circuit with a modulation range corresponding to the voltage to be supplied to said circuit.

5. The information processing apparatus according to claim 4, further comprising a data table which stores a voltage value of the voltage to be applied to said circuit and a modulation range for the clock frequency of the clock, in association with each other.

6. The information processing apparatus according to claim 4, wherein said clock control circuit does not modulate the clock frequency of the clock to be supplied to said circuit if a voltage corresponding to the voltage to be supplied to said circuit is not less than a predetermined value.

7. A control method for an information processing apparatus having a circuit, comprising:
a storing step of storing in a storage information indicative of a voltage to be applied to the circuit; and
a modulating step of modulating a clock frequency of a clock to be supplied to the circuit with a modulation range corresponding to the information stored in said storage.

8. The control method according to claim 7, further comprising a storage step of storing a data table which stores a voltage and a modulation range for the clock frequency of the clock, in association with each other.

9. The control method according to claim 7, wherein in said modulating step, the clock frequency of the clock to be supplied to said circuit is not modulated if a voltage corresponding to the information in said storage is not less than a predetermined value.

10. A control method for an information processing apparatus having a circuit, comprising:
a power supply step of supplying a voltage to the circuit; and
a clock control step of modulating a clock frequency of a clock to be supplied to the circuit with a modulation range corresponding to the voltage to be supplied to the circuit.

11. The control method according to claim 10, further comprising a storage step of storing a data table which stores a voltage value of the voltage to be applied to the circuit and a modulation range for the clock frequency of the clock, in association with each other.

12. The control method according to claim 10, wherein in said clock control step, the clock frequency of the clock to be supplied to said circuit is not modulated if a voltage corresponding to the voltage to be supplied to the circuit is not less than a predetermined value.

* * * * *